United States Patent [19]

Hazama et al.

[11] Patent Number: 4,636,626

[45] Date of Patent: Jan. 13, 1987

[54] APPARATUS FOR ALIGNING MASK AND WAFER USED IN SEMICONDUCTOR CIRCUIT ELEMENT FABRICATION

[75] Inventors: Junji Hazama; Kinya Kato, both of Kawasaki; Akikazu Tanimoto, Yokohama; Hisao Izawa, Kawasaki, all of Japan

[73] Assignee: Nippon Kogaku K.K., Tokyo, Japan

[21] Appl. No.: 570,189

[22] Filed: Jan. 12, 1984

[30] Foreign Application Priority Data

| Jan. 14, 1983 | [JP] | Japan | 58-3316 |
| Jan. 18, 1983 | [JP] | Japan | 58-5183 |
| Jan. 18, 1983 | [JP] | Japan | 58-5184 |

[51] Int. Cl.[4] .............................. G01J 1/20
[52] U.S. Cl. ......................... 250/201; 250/557
[58] Field of Search ............... 250/201, 201 AF, 204, 250/557, 560, 561; 356/4

[56] References Cited

U.S. PATENT DOCUMENTS

| 3,796,497 | 3/1974 | Mathisen et al. | 250/201 |
| 3,990,798 | 11/1976 | White | 356/172 |
| 4,243,877 | 1/1981 | Cruz | 250/201 |
| 4,315,201 | 2/1982 | Suzuki et al. | 318/640 |
| 4,395,117 | 7/1983 | Suzuki | 250/557 |
| 4,504,144 | 3/1985 | Trost | 250/201 |

Primary Examiner—Davis L. Willis
Assistant Examiner—James G. Gatto
Attorney, Agent, or Firm—Michael N. Meller

[57] ABSTRACT

An alignment apparatus for aligning a semiconductor wafer with an optical mask containing a circuit pattern to be exposed onto the wafer in the fabrication of semiconductor devices by a proximity exposure apparatus. The alignment apparatus includes light beam radiating means for radiating a first and second light beams which are imaged at positions separated by a given gap in a direction substantially perpendicular to two flat sheets, first and second detecting means for respectively detecting the imaging condition of the first and second light beams at the flat sheets, means for relatively moving the light beam radiating means and the flat sheets, and means for discriminating the order of generation of signals from the first and second detecting means, whereby the value of each gap between the selected areas of the two flat sheets at a plurality of places is detected with a high degree of accuracy without changing the gap between the flat sheets thereby making it possible to correct the parallelism, inclination, etc., of the flat sheets.

25 Claims, 35 Drawing Figures

FIG. 14
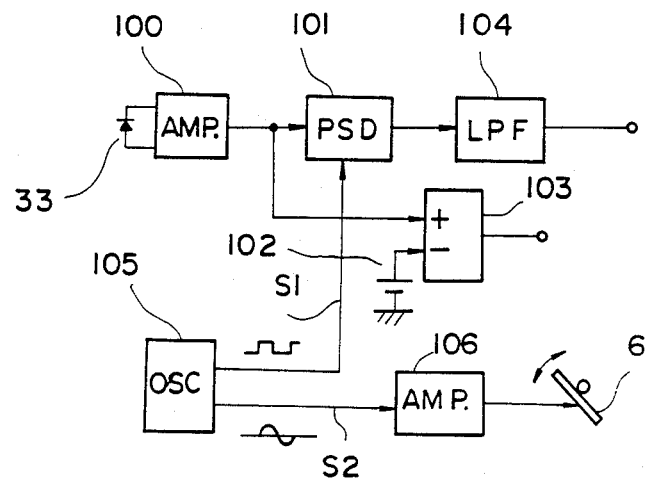
FIG. 15A
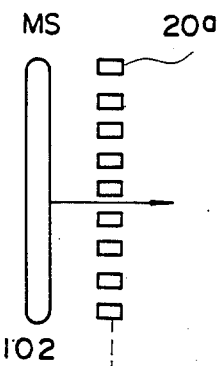
FIG. 15B
FIG. 15C
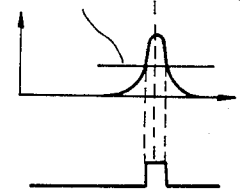
FIG. 16A
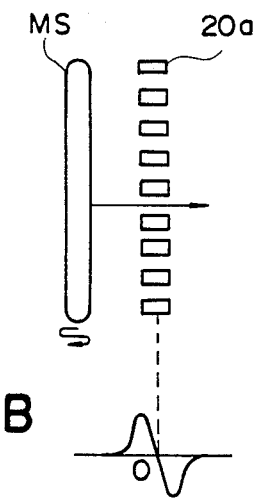
FIG. 16B
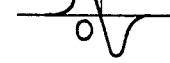

APPARATUS FOR ALIGNING MASK AND WAFER USED IN SEMICONDUCTOR CIRCUIT ELEMENT FABRICATION

BACKGROUND OF THE INVENTION

The present invention relates to an alignment apparatus, particularly an apparatus for aligning a mask with a wafer when the pattern on the mask is to be exposed onto the wafer in an equipment for fabricating semiconductor devices, such as, ICs or LSIs, and more particularly the invention relates to an alignment apparatus used with a proximity exposure system.

In the past, aligning methods for proximity exposure purposes have been known in which, as disclosed in U.S. Pat. No. 4,315,201, a laser beam is passed through an objective lens having a small numerical aperture to produce a spot focussed on both a mask and a wafer and the spot is used to scan, thereby detecting the scattered light from the alignment marks on the mask and the wafer. However, if the laser beam is passed through an objective lens having a small numerical aperture so as to focus the laser beam on both a mask and a wafer as in the above-mentioned method, this inevitably results in a large laser spot and a high resolution is not obtained, making it difficult to effect a highly accurate alignment.

Then, another method is conceivable in which, as disclosed in U.S. Pat. No. 3,990,798, a bifocal lens is used and a laser beam is passed through an objective lens having a large numerical aperture, thus separately focussing the laser beam on a mask and a wafer. However, to simply use the bifocal lens is inevitably disadvantageous in that the marks on the mask and the wafer interfere with the luminous flux of the laser beam, etc., and thus it is impossible to make the alignment with satisfactory accuracy.

On the other hand, in order to effect the alignment with satisfactory accuracy, a high degree of accuracy is required for the scanning mechanism of the above-mentioned method. For example, in order to scan with an amplitude of 100 μm and attain the desired positional accuracy of 0.01 μm, the required accuracy for the scanning mechanism becomes 0.01/100=0.01% and therefore the conventional scanning mechanisms have been inadequate for the desired alignment with high accuracy.

SUMMARY OF THE INVENTION

It is an object of the present invention to provide an alignment apparatus capable of aligning two oppositely-positioned flat sheets with each other with a high degree of accuracy.

It is another object of the invention to provide such alignment apparatus capable of detecting the gap between the two flat sheets with a high degree of accuracy.

To accomplish the above objects, an embodiment of the invention includes light beam radiating means for radiating first and second light beams so as to be imaged at positions which are apart by a given gap in a direction substantially perpendicular to two flat sheets, first and second detecting means for respectively detecting the imaging of the first and second light beams on the flat sheets, means for moving the first and second light beams and the flat sheets relative to one another, and means for discriminating the sequence of the generation of signals from the first and second detecting means.

Another embodiment of the invention includes light beam radiating means for radiating first and second light beams so as to be respectively imaged at first and second planes facing each other with a given gap therebetween such that the imaging positions are separated by a given distance in an expanding direction of the first and second planes; first control means whereby when the first and second light beams fall onto two opposed flat sheets from the side of the flat sheet having light transmission properties, in response to the imaging conditions of the light beams on the flat sheets, the flat sheets are controlled to substantially coincide with the first and second planes, respectively; and second control means for relatively displacing the flat sheets in the expanding direction of the first and second planes in such a manner that the first light beam illuminates the fiducial marks on one of the flat sheets and the second light beam illuminates the fiducial marks on the other flat sheet.

Preferably, the light beam radiating means includes an objective lens whose depth of focus at the wavelength of the first and second light beams is smaller than the given gap between the first and second planes and the first and second beams are radiated through the objective lens.

Also, in order to generate the first and second light beams, the light beam radiating means comprises an optical system for dividing a beam of coherent light into two light beams by polarization and an optical length correcting optical system for differing the optical lengths of the two separated light beams in accordance with the given gap between the first and second planes.

BRIEF DESCRIPTION OF THE DRAWINGS

FIG. 14 is a block diagram showing an example of the detector circuit.

FIG. 15A is a schematic diagram showing the manner of marks and a beam spot when the alignment is made without oscillating the oscillatory mirror.

FIGS. 15B and 15C are waveform diagrams showing a detection signal of FIG. 15A.

FIG. 16A is a schematic diagram showing the manner of marks and a beam spot when the alignment is made with oscillating the oscillatory mirror.

FIG. 16B is a waveform diagram showing a detection signal of FIG. 16A.

DESCRIPTION OF THE PREFERRED EMBODIMENTS

FIGS. 1 to 5 show an alignment optical system in an alignment apparatus according to a first embodiment of the present invention.

Figure 1:
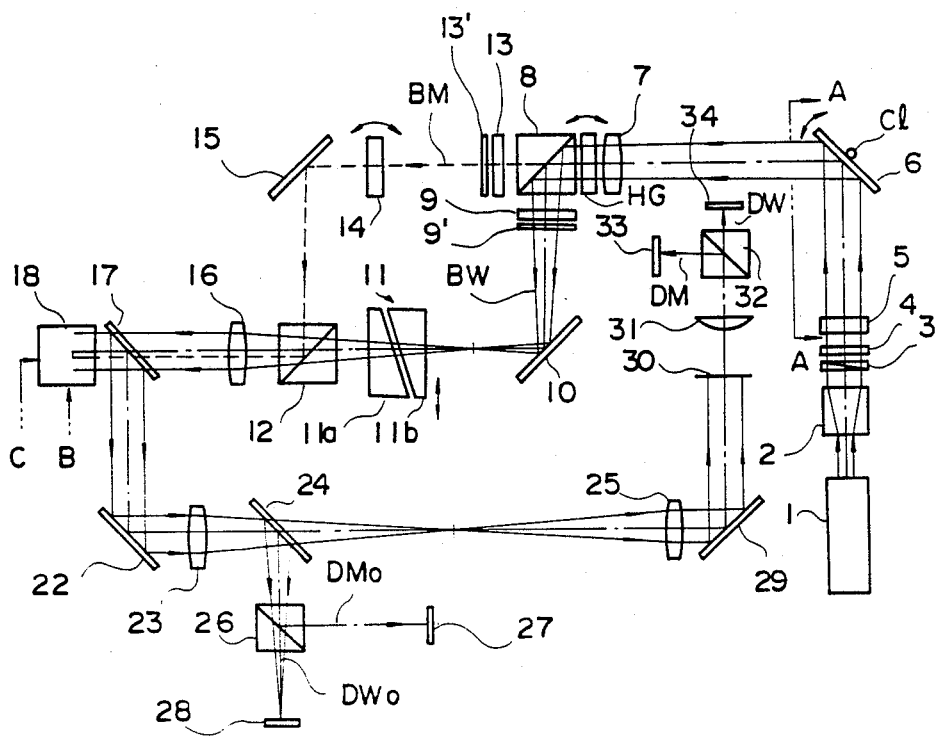
FIG. 1 is an optical path diagram of an optical system of an alignment apparatus according to a first embodiment of the present invention.
Figure 2:
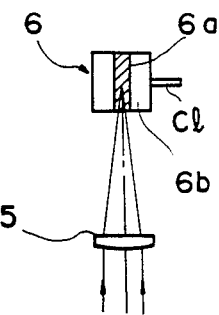
FIG. 2 is a view taken in the direction of the line A—A of FIG. 1.

In FIG. 1, the laser beam radiated from a laser light source 1 is converted to parallel rays through a beam expander 2, a polarizing plate 3 and a quarter wave plate 4 and the parallel rays fall on a cylindrical lens 5. In this case, the laser beam is converted to a circular polarized light through the polarizing plate 3 and the quarter-wave plate 4. The cylindrical lens 5 converts the parallel rays to a light beam having a narrow band shape in section and the light beam reaches an oscillatory mirror 6. Note that the focal position of the cylindrical lens 5 coincides with the center of the oscillatory mirror 6. The laser beam emitted from the cylindrical lens 5 results in an elongated beam spot converged into the paper plane on the reflecting surface of the oscillatory mirror 6. In other words, the cylindrical lens 5 has no power within the paper plane of FIG. 1 and it exhibits power in a direction perpendicular to the paper plane. The light beam reflected by the oscillatory mirror 6 spreads in a direction perpendicular to the paper plane in FIG. 1, is passed through a lens 7 whose focal point coincides with the center of the oscillatory mirror 6 and through a parallel flat glass HG which shifts the light beam within the paper plane and then reaches a beam splitter 8. Note that the oscillatory mirror 6 includes a pivot cl so that the light beam reaching the lens 7 is caused to make small oscillations. As shown in FIG. 2, the oscillatory mirror 6 is composed of an elongated reflecting portion 6a shaped in conformity with the sectional shape of an elongated beam spot and a transparent portion 6b. The reason for forming the reflecting portion 6a into an elongated shape is to prevent any backtalk of the return light to the laser light source 1. This backtalk-preventing action is also performed by the polarizing plate 3 and the quarter-wave plate 4.

Figure 8:
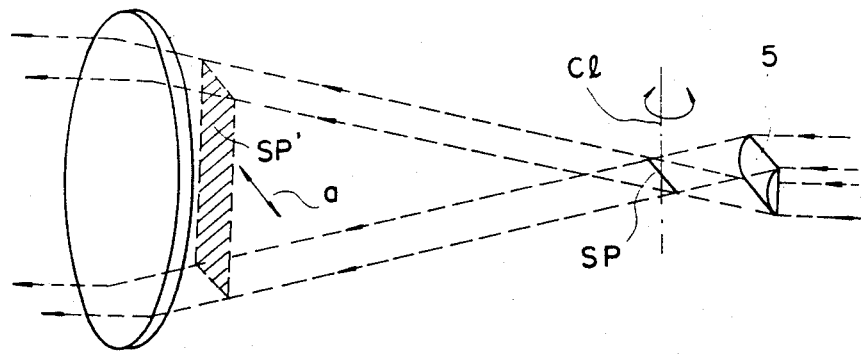
FIG. 8 is a schematic diagram for explaining the states of the light beams with respect to an oscillatory mirror.

The light beams produced by the cylindrical lens 5, the oscillatory mirror 6 and the lens 7 will now be described in detail with reference to FIG. 8. The light beam radiated from the cylindrical lens 5 is converged into a narrow elongated beam spot SP on the reflecting surface of the oscillatory mirror 6. Then, the beam spot SP is diverged at a fixed angle so that when the beam spot SP falls on the lens 7, it results in a light beam SP' which extends in a direction perpendicular to the lengthwise direction of the beam spot SP as shown by the hatched portion in FIG. 8. Thus, in order that the light beam SP may be caused to make small oscillations as shown by an arrow a, it is only necessary to cause the beam spot SP to make reciprocating rotational motion about the pivot Cl of the oscillatory mirror 6 which is perpendicular to the lengthwise direction of the beam spot SP.

Now returning to the description of FIG. 1, the elongated light beam incident to the beam splitter 8 is divided into two beams so that one of the two light beams or a wafer illuminating light beam BW passes through a half-wave plate 9, is reflected by a mirror 10, passes through an optical length correcting prism 11 and arrives at a beam splitter 12. The other of the light beams divided by the beam splitter 8 or a mask illuminating light beam BM passes through a half-wave plate 13 and a parallel flat glass 14 (hereinafter simply referred to as a HG glass 14) tiltable to shift the light beam, is reflected by a mirror 15 and then arrives at the beam splitter 12. In this embodiment, each of the beam splitters 8 and 12 comprises a polarizing half prism which divides a light beam by polarization so as to improve the S/N ratio of a photoelectric signal. Then, polarizing plates 9' and 13', whose polarizing directions are perpendicular to each other, are positioned after the half-wave plates 9 and 13, respectively.

The light beams BW and BM falling on the beam splitter 12 are again combined into a single light beam and the combined light beam passes to a mirror 18 through a lens 16 and a half mirror 17. The mirror 18 is inclined at an angle of 45° so that the light beam from the mirror 17 is reflected downward in the paper plane. On the other hand, the mirror 15 is set so that the center of the light beam BM combined by the beam splitter 12 is made eccentric with the center of the light beam BW in accordance with a given amount of deviation between the alignment marks on a wafer and the alignment marks on a mask as will be described later.

Figures 3A, 3B:
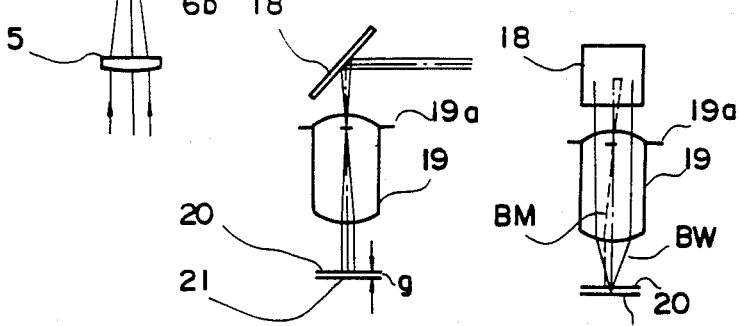
FIGS. 3A and 3B are views respectively taken in the direction of arrows B and C in FIG. 1.

An objective lens 19, shown in FIGS. 3A and 3B, is such that the combined light beams BM and BW are respectively converged onto the pattern surface of a mask 20 and the pattern surface of a wafer 21 and thus a narrow elongated spot is imaged at each of the pattern surfaces. Assuming that the gap between the mask 20 and the wafer 21 (a socalled proximity gap) is represented by g, then the numerical aperture of the objective lens 19 is selected large so that its depth of focus becomes sufficiently small as compared with the gap g. Also, the gap g is an inherent value which will be determined optionally in accordance with each exposure system. Thus, two trapezoidal prisms 11a and 11b of the optical length correcting prism 11 are moved relatively and adjusted in such a manner that the light beams BM and BW form elongated beam spots at positions which are apart by the gap g in the direction of the optical axis of the objective lens 19. Note that the light beam passed through the prisms 11a and 11b becomes a converged beam within the paper plane and a parallel beam in a direction perpendicular to the paper plane due to the action of the cylindrical lens 5. Also, the lens 7 and the lens 16 form an afocal system and it is arranged so that the center of the oscillatory mirror 6 coincides with the focal position of the lens 7 and a pupil 19a of the objective lens 19 coincides with the focal position of the lens 16. As a result, irrespective of the presence or absence of the optical length correcting prism 11, the oscillatory mirror 6 and the pupil 19a of the objective lens 19 become optically conjugate, thus forming a telecentric illuminating optical system.

With the light beam radiating means constructed as described above, when the elongated beam spots formed on the mask and the wafer illuminate the alignment marks on the mask and the wafer, a diffracted light including a zero-order light is emitted as an optical information from each of the marks. In this case, a reflected light will be emitted even if the mask and the wafer each have a flat surface without any mark. This light information returns as backtalk to the objective lens 19, is reflected by the mirror 18, the half mirror 17 and a mirror 22 and then arrives at a lens 23. A part of the light information passed through the lens 23 is transmitted through half mirror 24 and arrives at a lens 25. The focal position of the lens 23 is set so as to coincide with the pupil 19a of the objective lens 19. Then, the lens 23 and the lens 25 form an afocal system and the half mirror 24 is arranged in the parallel optical paths of the former.

The backtalk light beams arriving at the lens 23 are substantially parallel within the paper plane of FIG. 1 and they become converged beams in a direction perpendicular to the paper plane. As a result, the light beams become parallel beams in the direction perpendicular to the paper plane between the lenses 23 and 25. Then, the light information reflected by the half mirror 24 falls on a polarizing half prism 26 similar to the half prisms 8 and 12. The polarizing half prism 26 separates the light information by polarization into two beams, i.e., a zero-order beam $DM_O$ from the mask 20 and a zero-order beam $DW_o$ from the wafer 21 and they are respectively directed to the photosensitive surface of one-dimensional image sensors 27 and 28 such as CCDS. The one-dimensional image sensors 27 and 28 are photoelectric transducers for detecting the magnitude of the beam spots on the mask and the wafer, respectively.

Figure 4A:
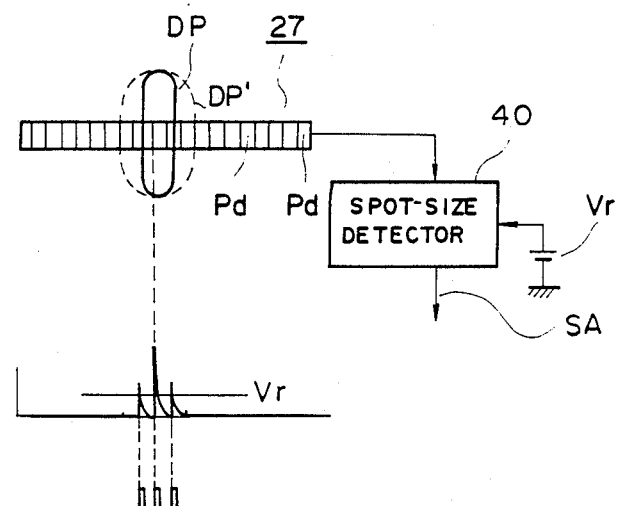
FIG. 4A is a circuit diagram of a one-dimensional image sensor and a spot-size detecting system.
Figure 4B:
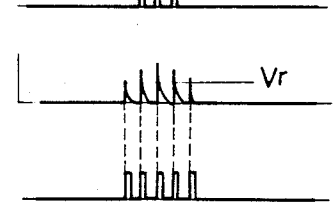
FIGS. 4B and 4C are output waveform diagrams of the circuit shown in FIG. 4A.
Figure 4C:

As shown in FIG. 4A, the one-dimensional image sensor 27 is positioned so that the direction of arrangement of its photosensitive elements Pd and the lengthwise direction of the beam spot cross each other at right angles. When the beam spot MS is imaged accurately at the reflective thin film of chromium, gold or the like on the mask, a beam spot DP is also imaged accurately on the image sensor 27. In this case, the width of the beam spot DP becomes minimum and the image sensor 27 generates by read scanning such a signal as shown in FIG. 4B. A spot-size detector circuit 40 compares this signal with a suitable level Vr to generate a pulse train. Also, when the beam spot MS becomes obscure, the beam spot DP is increased in width as shown at DP'. As a result, the image sensor 27 generates a signal as shown in FIG. 4C and thus the number of pulses in the resulting pulse train is increased. Then, the detector circuit 40 counts the pulse train so that when the count value becomes minimum, it is determined that the beam spot MS is in focus with the mask 20 and a detection signal SA is generated.

Note that the one-dimensional image sensor 28 detects the in-focus condition of the beam spot WS on the wafer 21 in the same manner.

The light information passed through the lens 25 from the mask and the wafer is reflected by a mirror 29 and arrives at a spatial filter 30 which cuts off the zero-order light $DM_o$ and $DW_o$ and transmits the diffracted light of the other orders. The diffracted light of the first order or over is concentrated by a condensing lens 31 and the light falls on a polarizing half prism 32. The polarizing half prism 32 separates the diffracted light into a diffracted light DM from the mask and a diffracted light DW from the wafer which are directed to photoelectric sensors 33 and 34, respectively.

Figure 5:
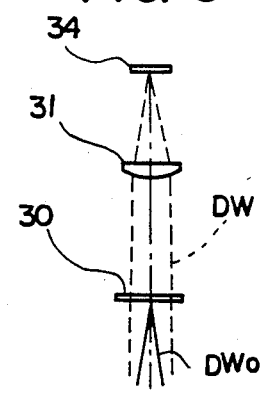
FIG. 5 is a partial optical path diagram of FIG. 1.

FIG. 5 shows the relation between the arrangement of the spatial filter 30, the condensing lens 31 and the photoelectric sensor 34, the zero-order light $DW_o$ and the diffracted light DW. The spatial filter 30 is arranged at the focal position of the lens 25. As a result, the pupil 19a of the objective lens 19 and the spatial filter 30 become conjugate and thus the pupil image of the objective lens 19 is formed on the spatial filter 30. Note that the spatial filter 30 may be comprised of a transparent plate including an elongated light shielding portion corresponding to the shape of the beam spot for zero-order light cutting purposes. In the case of the optical system in FIG. 1, of the laser beam incident on the beam splitter 8 a polarization direction component P is transmitted through the beam splitter 8 and a component S is reflected. If the half-wave plates 9 and 13 are not present, the light beam BM becomes the component S, is reflected by the mirror 15 and is transmitted without being reflected by the beam splitter 12. On the other hand, the light beam BW becomes the component P so that after it has been reflected by the mirror 10, it is reflected without being passed through the beam splitter 12. Thus, the half-wave plates 9 and 13, are included and the polarization direction of each of the light beams BM and BW is rotated through 90°, thereby combining the light beams BM and BW and radiating the combined light beam to the left side in FIG. 1 from the beam splitter 12.

Note that where the light beams BM and BW are combined and radiated by the beam splitter 12 in a downward direction in FIG. 2, the half-wave plates 9 and 13 are not needed.

Figure 6A:
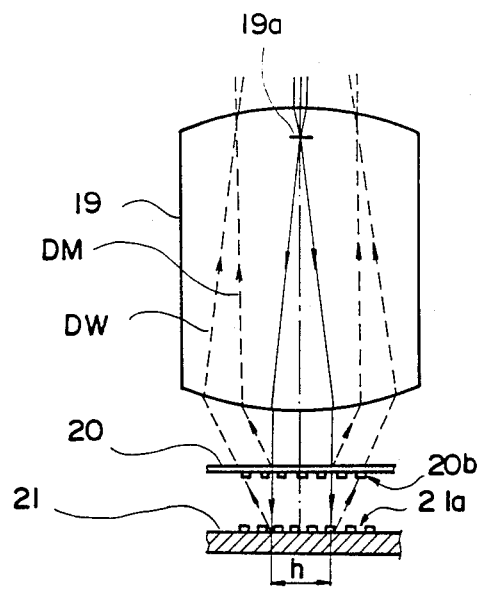
FIGS. 6A and 6B are enlarged optical path diagrams of FIGS. 3A and 3B, respectively.
Figure 6B:
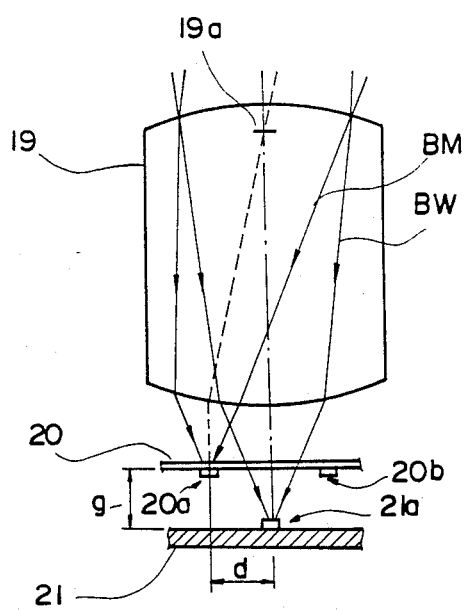
Figure 7:
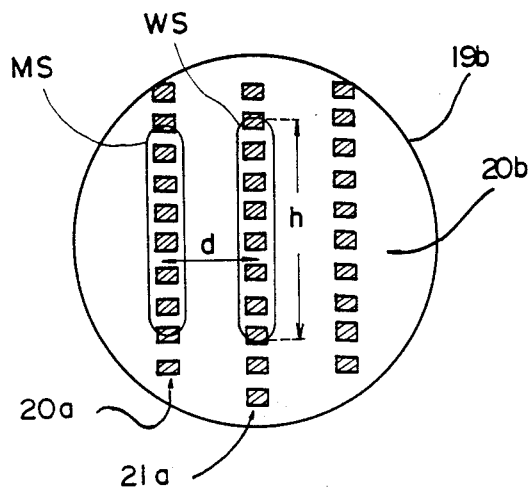
FIG. 7 is a diagram for explaining the positional relation between the beam spots and marks within the visual field of an objective lens.

Next, the relation between the beam spots formed by the objective lens 19 and the marks on the mask and the wafer will be described with reference to FIGS. 6A, 6B and 7.

The light beam BW falls on the objective lens 19 in such a manner that its center coincides with the optical axis of the objective lens 19. The elongated beam spot WS provided by the light beam BW is passed through the transparent portion of the mask 20 and then it is imaged at marks 21a formed in a diffraction grating pattern about 5 μm wide and 100 μm long on the wafer 21. On the other hand, the elongated beam spot MS provided by the light beam BM is imaged on marks 20a formed on the mask 20 in the form of a grating pattern about 5 μm wide and 100 μm long at a position which is eccentric horizontally by a distance d with the optical axis of the objective lens 19. Also, the beam spots WS and MS are set to extend parallel to each other and their lengthwise directions respectively correspond to the direction of grating arrangement of the marks 20a and 21a, respectively. Also, the widths of the beam spots WS and MS are respectively selected substantially equal to the width of the marks 20a and 21a. Then, the beam spots WS and MS are each oscillated in a direction perpendicular to its lengthwise direction in synchronism with each other. In accordance with this embodiment, the amplitude of this oscillation is selected substantially the same with the width of the marks 20a and 21a. As a result, in accordance with the present embodiment the diffracted light DM and DW from the marks 20a and 21a return as backtalk to the objective lens 19 at such angles that they diverge in the lengthwise directions of the beam spots MS and WS, respectively, as shown in FIG. 6A. Note that by increasing a length h with respect to the width of the beam spots MS and WS, it is possible to improve the accuracy of position detection of the marks 20 and 21a. The reason is that the increased length h produces more diffracted light and thus the S/N ratio of detection signals is improved. Also, similar marks 20b are formed parallel to the marks 20a on the mask 20. The distance between the marks 20a and 20b is selected so as to not shield the optical path of the light beam BW which is determined by the numerical aperture of the objective lens 19 and the gap g. In fact, the marks 20b make no contribution to the photoelectric mark detection. However, if the marks 20b are arranged such that the distance between the marks 20a and 20b becomes 2d, it is extremely convenient for making the alignment by visual observation.

Figure 9:
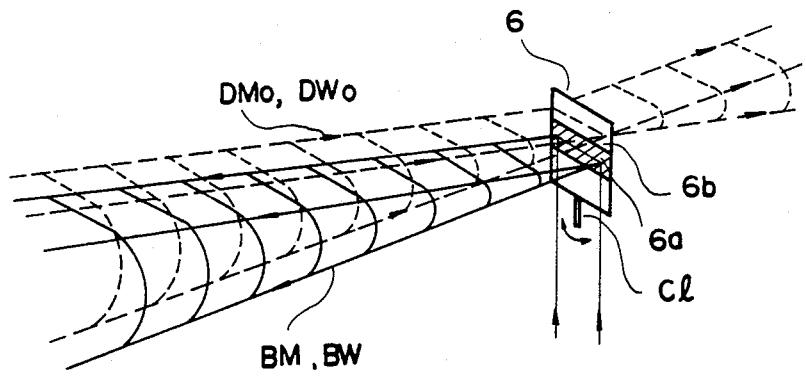
FIG. 9 is a schematic diagram showing a modification of the oscillatory mirror for preventing any backtalk to a laser light source.

Of the zero-order light beams $DM_o$ and $DW_o$ and the diffracted light DM and DW, the light beams $DM_o$ and $DW_o$ arrive at the oscillatory mirror 6 through the mirror 18, the half mirror 17 and the beam splitters 12 and 8 and then they fall as backtalk on the laser light source 1. Thus, as shown in FIG. 9, the optical paths of the elongated light beams BM and BW from the laser light source 1 and the light beams $DM_o$ and $DW_o$ are slightly shifted from each other. Thus, in this embodiment the mirror 18 is slightly tilted from 45°. More specifically, the position of the mirror 18 shown in FIG. 3A is slightly rotated within the paper plane. When this occurs, the beam spots MS and WS of FIG. 7 are both shifted slightly in the lengthwise direction within a field of view 19b. However, this shift does not change the distance d between the beam spots MS and WS so that it does not cause any error in the detection of the marks 20a and 21a and hence the accuracy is not deteriorated.

Next, a mask-wafer alignment apparatus equipped with the alignment optical systems according to the embodiment of the invention will be described with reference to FIG. 10. Arranged on a base 50 is a stage 51 for two-dimensionally moving a wafer 21 and the stage 51 is movable along an x - y plane by a two-dimensional actuator 52 (hereinafter referred to as an ACT 52). The coordinate position of the stage 51 is detected by a laser interferometer 53. Also disposed on the stage 51 is a wafer holder 54 which holds, slightly rotates or tilts the wafer relative to the stage 51 or vertically moves the wafer in a z-axis direction perpendicular to the x - y plane. The various movements of the wafer holder 54 are effected by an actuator 55 arranged on the stage 51. Also, diffraction grating type fiducial marks 56 similar to the marks 20a and 21a are provided on the wafer holder 54 for the correction of the alignment optical systems and the detection of the mask-wafer gap g.

On the other hand, a mask position adjusting actuator 58 is mounted at the forward end of a column 57 which is extended from the base 50. The actuator 58 is operable to rotate, move vertically in a z direction or tilt a mask holder 59 holding the mask. An alignment optical system 60 is arranged in such a manner that the previously mentioned objective lens 19 is positioned above the mask. The alignment optical system 60 is moved by an actuator 61 in a manner indicated by the arrows so as to come into and out of the position above the mask. The actuator 61 also detects the amount of such movements. Note that while the alignment optical system 60 includes the entire construction shown in FIG. 1, it is possible to move only the objective lens 19, the mirror 18, the half mirror 17, the lens 16, the mirror 22 and the lens 23 as a unit for movment into and out of the position. A detector 62 receives the photoelectric signals from the one-dimensional image sensors 27 and 28 and the photoelectric sensors 33 and 34 for mark detecting and focusing detecting purposes. In other words, the detector 62 is responsive to the output signals of the one-dimensional image sensors 27 and 28 to detect the size of the beam spot images on the mask and the wafer and it also detects the imaging conditions of the light beams BM and BW or the deviations in position. Also, the detector 62 controls the inclination of the parallel flat glasses HG shown in FIG. 1. The ACTs 52, 55, 58 and 61, the laser interferometer 53 and the detector 62 are controlled by a control device 63 comprising a microcomputer or the like.

Figure 10:
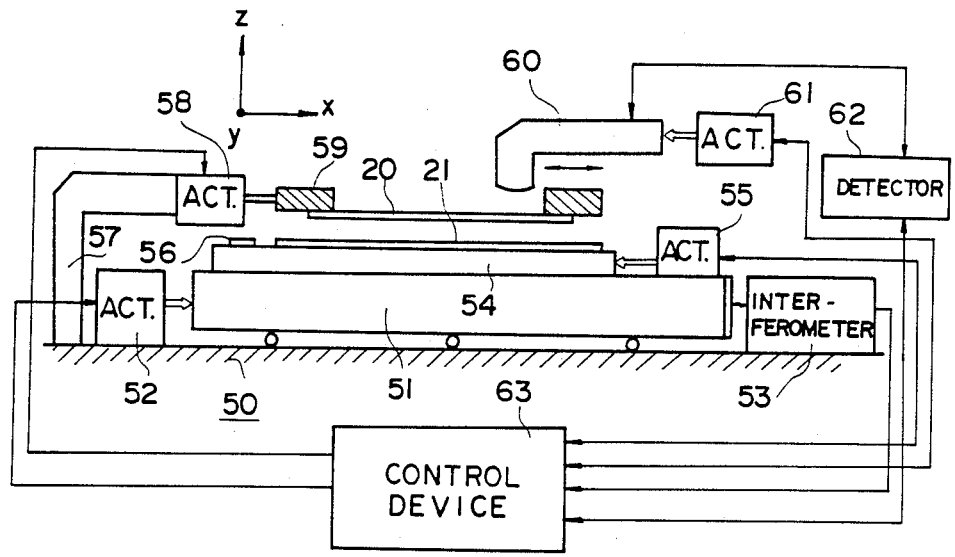
FIG. 10 is a schematic diagram showing the apparatus according to the first embodiment of the invention.
Figure 11:
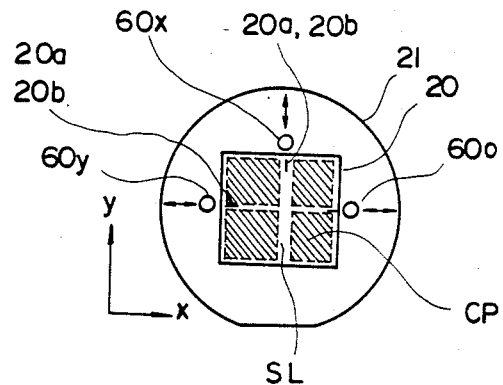
FIG. 11 is a schematic plan view showing an example of an arrangment of the alignment optical systems with respect to a mask and a wafer.

While, in FIG. 10, only the single alignment optical system is shown, in fact three alignment optical systems 60x, 60y and 60θ are arranged around the mask as shown in FIG. 11. In FIG. 11, each of the alignment optical systems 60x, 60y and 60θ is indicated in terms of the visual field of the objective lens and each objective lens is moved into and out of the position above the mask as shown by the arrows. Also, in this case, the mask used may be of a so-called multidie type which is formed with four circuit pattern areas CP (hereinafter referred to as chips CP) parted by street lines SL as indicated by the shaded portions in FIG. 11. Then, the marks 20a and 20b shown in FIG. 7 are arranged on the street lines SL in the mask peripheral portions at three places corresponding to the positions of the alignment optical systems 60x, 60y and 60θ. Also, the marks 20a and 20b are arranged to extend radially from the center of the mask. Thus, the marks 20a and 20b at the three places are observed simultaneously so that the alignment optical system 60θ detects the x-direction positions of the mask and the wafer, the alignment optical system 60y similarly detects the y-direction positions, and the alignment optical system 60θ detects, along with the alignment optical system 60y, the rotation of the mask and the wafer.

Note that each of the three alignment optical systems 60x, 60y and 60θ includes the one-dimensional image sensors 27 and 28 so as to detect the gap g between the mask and the wafer at the three positions on the mask.

Figure 12:
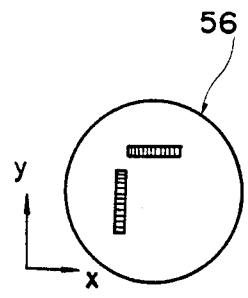
FIG. 12 is an enlarged plan view showing an example of fiducial marks.
Figure 13A:
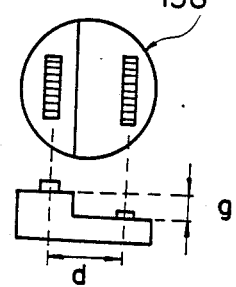
FIGS. 13A and 13B are respectively enlarged plan view and front views showing another example of the fiducial marks.
Figure 13B:
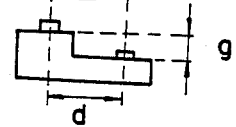

On the other hand, the fiducial marks 56 of FIG. 10 comprise marks arranged in two grating patterns extending in the x and y directions for the alignment in the x and y directions as shown in FIG. 12. As a modification of the fiducial marks, they may be arranged in correspondence to the imaging positions of two beam spots MS and WS of the laser beams as shown in FIGS. 13A and 13B. In this case, the two parallel grating type patterns are apart by the distance d and also they are arranged to differ in height by an amount corresponding to the gap g. The use of these marks 156 has the advantage of simplifying the correction and the alignment operation of the alignment optical systems considerably.

An example of the detecting circuit incorporated in the detector 62 will now be described with reference to FIG. 14. Note that the marks 21a on the wafer 21 are detected by a detecting circuit of substantially the same construction and will not be described.

The output signal of the photoelectric sensor 33 receiving the diffracted light DM from the marks 20a is applied to a preamplifier 100 which in turn generates a voltage signal corresponding to the light quantity of the diffracted light DM. The output signal of the preamplifier 100 is applied to a phase detector (PSD) 101 and it is also applied to a comparator 103 which compares the signal with a reference voltage 102. The output signal of the PSD 101 is applied to a low-pass filter (LPF) 104 which in turn generates it as a dc level signal corresponding to the difference in position between the marks 20a and the beam spot MS.

An oscillator (OSC) 105 generates a rectangular signal $S_1$ and a sinusoidal signal $S_2$ at the same frequency so that the rectangular signal $S_1$ is applied as a reference signal to detect the phase difference between it and the output signal of the preamplifier 100 and the sinusoidal signal $S_2$ is amplified by a power amplifier 106 for use as a drive signal for the oscillatory mirror 6 of FIG. 1. Generally, the PSD 101 may be comprised of a multiplier or the like and its output signal includes a ripple (high-frequency component). Thus, the LPF 104 passes only the dc level signal as mentioned previously.

The comparator 103 compares the output signal of the preamplifier 100 and the reference voltage 102 to determine whether the beam spot MS is practically in register with the marks 20a and the result of this determination may be utilized in making a coarse alignment. In other words, as shown in FIG. 15A, with oscillation of the oscillatory mirror 6 stopped, when the marks 20a are scanned by the beam spot MS and then the beam spot MS coincides with the marks 20a, the maximum diffracted light is generated and the peak appears in the time variation of the output signal from the preamplifier 100. This peak is compared with the reference voltage 102 by the comparator 103, thus generating a pulse signal as shown in FIG. 15c.

So long as this pulse signal is at a "H" level, it is an indication that the beam spot MS is substantially in register with the marks 20a and this can be used to effect a coarse alignment. Note that if the output signal of the preamplifier 100 is applied to the comparator 103 through a low-pass filter, the similar coarse alignment can be accomplished while allowing the oscillatory mirror 6 to oscillate.

Then, to effect a highly accurate alignment, the marks 20a are scanned by the beam spot MS while maintaining the oscillatory mirror 6 in oscillation. While, in this case, the oscillatory mirror 6 causes the beam spot MS to make small oscillations, the amplitude of these oscillations is preset substantially equal to the width of the marks 20a. In other words, when the marks 20a are scanned by the beam spot MS while making small oscillations as shown in FIG. 16A, the output signal of the LPF 104 becomes a sine-curve signal as shown in FIG. 16B. In other words, when the center of the beam spot MS completely coincides with the center of the marks 20a, the phase difference between the output signal of the preamplifier 100 and the rectangular signal from the OSC 105 is reduced to zero. Strictly speaking, at this time the frequency components of the output signal from the preamplifier 100 become zero with respect to the oscillation frequency of the OSC 105 and the output signal includes only the component of a frequency which is two times the oscillation frequency of the OSC 105. Also, in this case, a waveform is obtained which reverses in phase on the sides of the center 0 of the marks 20a and thus the output of the LPF 104 is reduced to zero when the center of the marks 20a completely coincides with the center of the beam spot MS. When there is a deviation, the LPF 104 generates at its output a signal which is positive or negative depending on the direction of the deviation. Thus, by effecting this zero adjustment, it is possible to make the alignment very accurately.

It is to be noted that the marks 21a on the wafer can also be detected by the identical detecting circuit which processes the output signal generated from the photoelectric sensor 34 in response to the beam spot WS.

Next, the overall operation of the apparatus according to the above-described embodiment will be described in accordance with the actual alignment procedure.

Since the marks 20a on the mask and the marks 21a on the wafer are respectively aligned by means of the beam spots MS and WS, an alignment error will be caused if the distance d is not established accurately. Although the distance d can be established by adjustments of greater accuracy so as to prevent such error, this still presents problems from the standpoint of long-term stability. Thus, in accordance with the present embodiment, the distance between the two beam spots MS and WS is determined first in accordance with the following method.

The stage 51 is moved first and the fiducial marks 56 are aligned with the beam spot WS provided by the wafer alignment light beam BW. In this case, the required focusing is effected by the one-dimensional image sensor 28 in such a manner that the focal position of the beam spot WS coincides with the height of the fiducial marks 56. The alignment of the beam spot WS with the fiducial marks 56 is effected by moving the stage 51 by means of the circuit of FIG. 14 in such a manner that the center of the light beam BW coincides with the center of the marks 56. After the diffracting grating pattern of the fiducial marks 56 has been aligned with the beam spot WS in this way, the wafer holder 54 is moved upward by an amount corresponding to the proximity gap g and then the stage 51 is moved toward the mask alignment light beam BM by an amount corresponding to the predetermined distance d between the marks 20a and 21a. This movement is effected while reading the measured value of the laser interferometer 53 and therefore a control of the order of 1/100 μm is possible.

Then, the light beam BM is moved in such a manner that the center of the beam spot MS provided by the light beam BM coincides with the center of the grating pattern of the fiducial marks 56. The movement of the light beam BM is effected by rotating the HG glass 14 of FIG. 1 while making the zero adjustment of the sine-curve signal from the LPF 104 of FIG. 14.

By virtue of the above-mentioned procedure, the distance between the beam spots MS and WS is accurately made equal to the distance d between the marks 20a and 21a and the subsequent operation of aligning the mask with the wafer is performed on the basis of the two beam spots MS and WS.

Note that if the fiducial marks 156 of FIG. 13 are used in the above-mentioned procedure, it is possible to eliminate the need for the movement of the stage 51, etc., and the time required for establishing the distance d can be reduced correspondingly.

Also, in the course of the above-mentioned procedure the fiducial marks 56 are used so as to effect the parallel-ing of the alignment optical systems 60y and 60θ shown in FIG. 11. In other words, it is adjusted so that the segment connecting the lengthwise directions of beam spots of the alignment optical systems 60y and 60θ coincides with the x direction of the stage 51.

More specifically, after the stage 51 has been positioned such that the spot WS by the light beam BW of the alignment optical system 60y coincides with the marks 56, the stage 51 is moved in the x direction so as to bring the marks 56 just below the alignment optical system 60θ. Then, the beam spots WS and MS are shifted in the y direction (the directions of the small oscillation) within the visual field 19b of the objective lens 19 in the alignment optical system 60θ, thereby causing the beam spot WS provided by the light beam BW of the alignment optical system 60θ to coincide with the marks 56. This shift is effected by rotating the HG glass 14 shown in FIG. 1.

In this way, the segment connecting the detection center (the center of small oscillations of the beam spot) of the alignment optical system 60y and the detection center of the alignment optical system 60θ is brought into coincidence with (or made parallel to) the x direction travel path of the stage 51.

When the centers of the beam spots MS and WS have been set to the distance d and the gap g in this way, as shown in FIG. 10, the wafer is placed on the wafer holder 54 and the mask is supported on the mask holder 59. Note that the mask is first placed on the wafer holder 54 and then it is transferred onto the mask holder 59 by moving the wafer holder 54 upward (or moving the mask holder 59 downward).

Then, the alignment optical systems 60 (60x, 60y, 60θ) are moved into the positions of FIG. 11 above the mask. These raised positions correspond to the three mark positions on the mask. Each of the alignment optical systems 60 detects one of the three marks 20a by means of the beam spot MS formed by the light beam BM and the mask holder 59 is moved by the actuator 58 in such a manner that the center of the small oscillations of the beam spot MS coincides with the center of the marks 20a. In this case, the focusing detection is performed simultaneously at the three positions of the alignment optical systems 60 and the inclination of the mask is also adjusted such that the marks at each of the three places are in focus with the beam spot MS.

In this way, the mask is positioned with respect to the light beam BM from each of the alignment optical systems 60 and thereafter the mask holder 59 is held stationary at its position.

On the other hand, it is assumed that the wafer is formed with pattern areas in matrix form in correspondence to the chips CP of the mask and also alignment marks 21 are formed on the street lines.

Also, the wafer includes a cutaway portion which is usually flat or a flat so that when the wafer is mounted on the wafer holder 54, the flat is utilized so as to position the wafer at a given position on the wafer holder 54. Thus, where the arrangement of the pattern areas within the wafer is known previously, the distance and direction from the fiducial marks 56 to each of the pattern areas within the wafer can be obtained approximately. For this purpose, it is only necessary that when the beam spot WS of the light beam BW in each of the alignment optical systems 60 coincides with the marks 56, the coordinate values of the stage 51 are measured by the laser interferometer 53 and are stored.

Then, in accordance with the coordinate values of the marks 56 the stage 51 is moved and the pattern area of the wafer is positioned just below the proper chip CP of the mask. In this way, the chips CP and the pattern areas can be aligned with one another with an error of about several tens μm.

Then, the detection of the three marks 21a on the wafer by the three alignment optical systems 60x, 60y and 60θ is started.

Then, the stage 51 is moved within the x-y plane by the processing circuits shown in FIG. 14 in such a manner that the oscillation center of the beam spots WS coincides with the center of the marks 21a on the wafer. By so doing, the marks 21a at the three places on the wafer are respectively aligned with the distance d with the marks 20a at the three places on the mask and the chips CP on the mask are respectively brought into exact register with the pattern areas on the wafer.

After the mask and the wafer have been aligned with each other in this way, the alignment optical systems 60 are retreated and an exposure illuminating light, X rays or the like is projected from above the mask, thereby transferring the pattern of the mask onto the light-sensitive layer on the wafer. When the pattern has been transferred onto some pattern area on the wafer, the stage 51 is moved a given distance. Then, the alignment optical systems 60 are again advanced into given positions above the mask. These advanced positions are determined such that the oscillation center of the beam spots MS by the light beam BM coincides with the marks 20a on the mask. However, the alignment optical systems 60 are advanced mechanically, thus causing mechanical positioning errors. Thus, after the alignment optical systems 60 have been advanced into the given positions, the HG glass 14 shown in FIG. 1 is rotated such that the oscillation center of the beam spot MS coincides with the marks 20a on the mask. Thereafter, as mentioned previously, the alignment is effected by moving the stage 51 such that the marks 21a on the wafer coincide with the oscillation center of the beam spots WS. In this way, the operation of moving the stage 51 a given distance is repeatedly performed with each exposure.

While, in the above-described embodiment, the alignment of the mask and the wafer is effected for the exposure of each small area, the invention is not intended to be limited thereto. For example, after the mask has been positioned through the paralleling of the alignment optical system 60y and 60θ, the stage 51 may be moved so that the alignment optical system 60y alternately detects the marks 21a arranged at two places on the wafer which are apart in the x direction (e.g., two places around the periphery of the wafer), thereby detecting the rotation of the wafer. Then, after the wafer holder 54 or the mask holder 59 has been relatively rotated by an amount corresponding to the amount of the wafer rotation, thereby aligning the relative positions of the mask and the wafer, the exposure may be performed successively. The exposure may be effected by only a so-called gloval alignment. On the other hand, even if the wafer holder 54 or the mark holder 59 is rotated, the rotational error cannot be improved in excess of the mechanical accuracy. Thus, in the course of the alternate detection by the alignment optical system 60y of the marks 21a at the two places apart in the x direction on the wafer, the following calculation is performed in accordance with the y-direction position $y_1$ of the stage 51 obtained when the marks 21a at the one place are brought into register with the detection center of the alignment optical system 60y and the position $y_2$ of the stage 51 obtained when the marks 21a at the other place are brought into register with the detection center of the alignment optical system 60y $$\sigma = \frac{y_1 - y_2}{l_x}$$

(where $l_x$ is the x-direction distance between the marks 21a at the two places). This results in the detection of the small inclination angle $\sigma$ between the segment connecting the two marks 21a on the wafer and the x-direction trave path of the stage 51. Thus, by feeding the stage 51 obliquely with respect to the x and y coordinate axes in accordance with the inclination angle $\sigma$ when advancing the stage 51 for exposing purposes, it is possible to effect the step-and-repeat exposure with the corrected inclination angle $\sigma$ or wafer rotation and thus the alignment is accomplished at a high speed with a high degree of accuracy. Also, the HG glass 14 of FIG. 1 need not be provided for each of the three alignment optical systems 60x, 60y and 60θ and the same effect can be obtained by providing the HG glass 14 for at least the alignment optical system 60θ.

Figure 17:
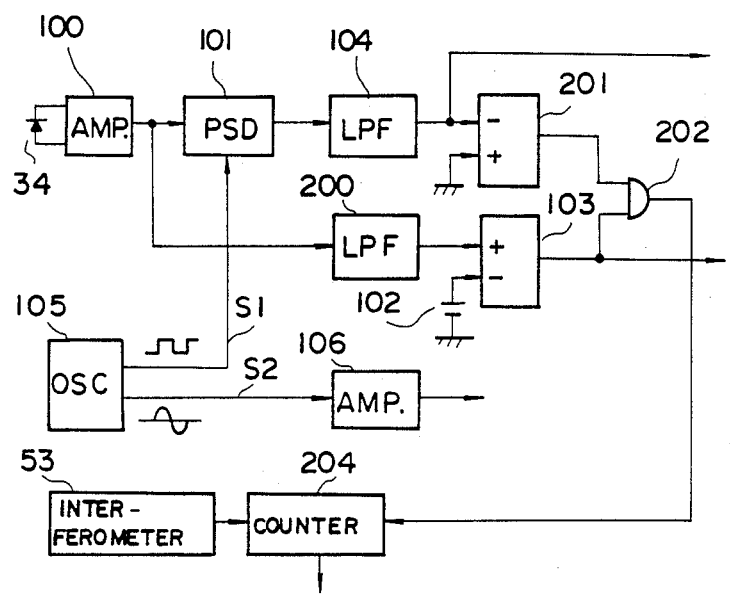
FIG. 17 is a block diagram showing another example of the detector circuit.

FIG. 17 shows a modification of the circuit of FIG. 14 which is suitable for detecting the diffracted light DW from the wafer 21.

The output signal of the preamplifier 100 is passed through a low-pass filter (LPF) 200 and then applied to the comparator 103. The output signal of the LPF 104 is applied to a comparator 201 to detect the zero-crossing point of the sine-curve signal from the PSD 101. An AND gate 202 receives the output signals from the comparators 103 and 201 and generates a detection pulse signal when the center of the marks 21a on the wafer 21 coincides with the oscillation center of the beam spot WS. A counter 204 is included in the control device 63 of FIG. 10 so as to count the interference fringes generated from the laser interferometer 53 and latch the count value in response to the leading edge of the detection pulse signal from the AND gate 202, thereby generating the count value.

Figure 18A:
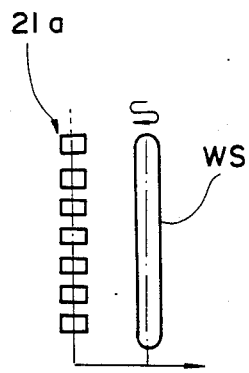
FIG. 18A is a schematic diagram showing the manner of marks and a beam spot in the alignment according to the detector circuit of FIG. 17.
Figure 18B:
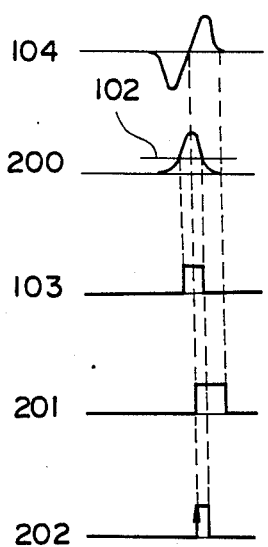
FIG. 18B is a waveform diagram showing detection signals.

With the construction described above, when the stage 51 is moved with respect to the beam spot WS making small oscillations so that the marks 21a are scanned as shown by an arrow in FIG. 18A, as shown in FIG. 18B, the LPF 104 generates a sine-curve signal and the LPF 200 generates a peak signal. The comparator 103 compares the peak signal with the reference level 102 and generates a pulse signal. On the other hand, the comparator 201 generates a pulse signal which goes to a high level only in response to the positive polarity of the sine-curve signal. As a result, the AND gate 202 generates a pulse signal whose leading edge coincides with the zero-crossing point of the sine-curve signal or the maximum point of the peak signal from the LPF 200. When the count value of the counter 204 is latched in response to the leading edge of the detection pulse signal from the AND gate 202 in this way, the position of the stage 51 or the position of the marks 21a obtained upon coincidence of the oscillation center of the beam spot WS with the center of the marks 21a is determined. Then, the stage 51 is returned so as to attain the latched count value and thereby accomplish the accurate alignment. In accordance with this modification, when the marks 21a are moved across the beam spot WS one time only, it is possible to effect the alignment in accordance with the count value of the laser interferometer 53, thus making possible the alignment at high speed. Further, since the position of the center of the marks 21a is detected by performing the AND operation on the pulse signal responsive to the zero-crossing point of the sine-curve signal from the PSD 101 and the pulse signal corresponding to the light intensity of the diffracted light DW, it is possible to effect the position detection accurately even if the stage 51 is not moved at a uniform speed during the scanning of the stage 51.

The above-described embodiment shows that the focusing detection of the objective lens can be effected by measuring the size of the beam spots on the mask and the wafer in the manner outlined in connection with FIGS. 4A to 4C. However, there are cases where even if such focusing detection is performed, the size of the beam spot does not practically change depending on the depth of focus of the lens. Also, the size of the photosensitive elements Pd of the one-dimensional image sensors 27 and 28 is finite and therefore it is impossible to detect any change of the beam spot smaller than the size of each photosensitive element Pd. As a result, it is conceivable to detect a change in the light quantity of each picture element and thereby effect the focusing detection with greater accuracy and this is very difficult.

Thus, the below-mentioned embodiment includes another control means for detecting the intensity of the diffracted lights from a mask and a wafer to effect the focusing detection with greater accuracy and thereby accomplish the alignment.

Figure 19:
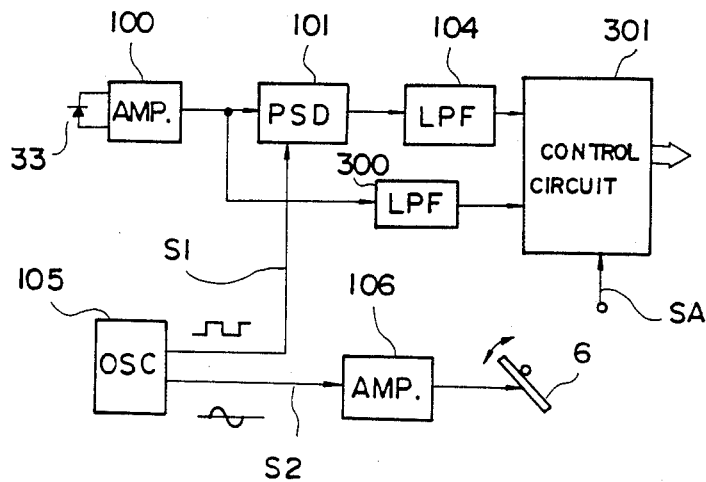
FIG. 19 is a block diagram showing still another example of the detector circuit.

Referring to FIG. 19, as in the case of FIG. 14, the preamplifier 100 amplifies the output signal of the photoelectric sensor 33 which receives the diffracted light DM from the marks on the mask or the wafer and the signal is applied to the phase detector circuit (PSD) 101 and a lowpass filter (LPF) 300.

The output signals from the LPF 300 and the LPF 104 are applied to a control circuit 301. Also, a detection signal $S_A$ from the spot size-detector circuit 40 of FIG. 4A is applied to the control circuit 301. The control circuit 301 includes a converter (A/D converter) for subjecting the output signal of the LPF 300 to analog-to-digital conversion. Thus, the digital value from the A/D converter corresponds to the light quantity of the diffracted light DM.

In the condition where the mask and the wafer are mounted in place, the actuators are operated by means of the one-dimensional image sensors 27 and 28 and the mask is aligned with the wafer in the gap direction. This alignment is a coarse alignment and the alignment can be made satisfactorily only if the reflected light from the mask and the wafer are obtained even if the marks 20 and 21a are not present within the oscillation scanning range of the beam spots MS and WS. When the coarse alignment has been completed, the spot-size detector circuit 40 generates a detection signal $S_A$ so that the control circuit 301 receives the signal $S_A$ and stops the operation of the actuators, thereby substantially holding the mask and the wafer in positions apart at the distance of the gap g.

Thereafter, in accordance with the outputs of the PSD 101 and LPF 104 the mask and the wafer are relatively moved in the x and y directions without changing the gap in such a manner that the marks 20a and 21a are respectively aligned with the oscillation centers of the beam spots MS and WS. This alignment will hereinafter be referred to as an x-y alignment.

Then, in order to precisely adjust the gap between the mask and the wafer, the output signal of the LPF 300 is applied to the control circuit 301 and the positioning of the mask in the z direction is effected first. In this case, the relation between the beam spot MS and the marks 20a becomes the same as FIG. 15A and the output signal of the photoelectric sensor 33 becomes as shown in FIG. 15B in response to the oscillation scanning of the beam spot MS. At this time, the output signal of the LPF 300 becomes a dc signal corresponding to the peak level of the output signal from the preamplifier 100.

Then the actuator moves the mask in the z direction in increments of a given amount (e.g., about 0.5 μm). Thus, in response to each moving step, the A/D converter samples the output signal of the LPF 300 and thus the sampled digital value and the z-direction position information of the mask based on the number of pulses qenerated from the encoder in the actuator are successively stored in the memory of the control circuit 301. From the digital values thus generated from the A/D converter and stored, the maximum value is obtained by digital processing and the corresponding z-direction position information is detected. Then, the mask is moved to this position, thus effecting the focusing very accurately. The z-direction position detection and alignment are also effected for the wafer in the same manner.

Next, a description will be given of an embodiment of an apparatus for measuring the gap between a mask and a wafer with a high degree of accuracy in accordance with the principle of the present invention.

Figure 20:
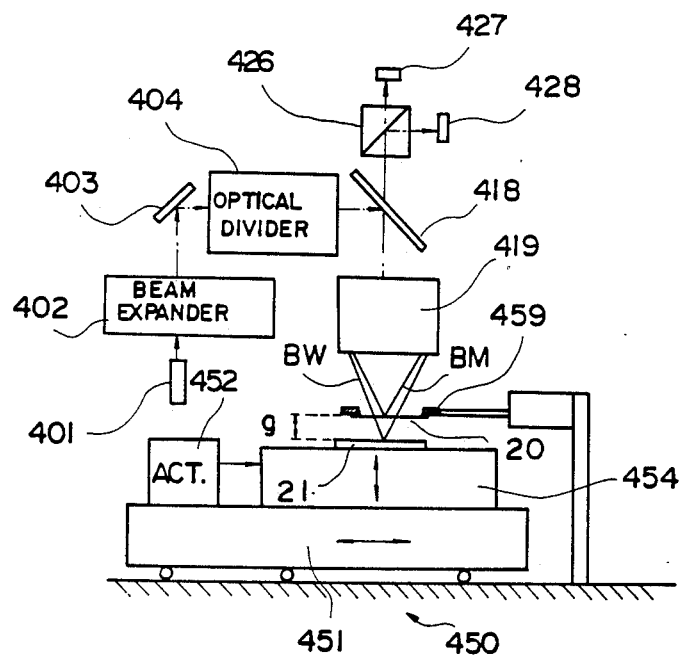
FIG. 20 is a schematic diagram showing an alignment apparatus according to another embodiment of the invention.

Referring to FIG. 20, the laser beam from a laser light source 401 is expanded into a light beam having an elongated sectional shape by a beam expander 402, is reflected by a mirror 403 and falls on an optical divider 404. The optical divider 404 may, for example, be a bifocal element composed of two pieces of crystal glued together with the directions of their crystal axes being perpendicular to each other. These elements form light beam radiating means for radiating first and second light beams whose imaging positions are apart by a given gap $g_o$.

The first and second laser beams radiated from the optical divider 404 are light beams whose polarization directions are perpendicular to each other and the two light beams are then reflected by a half mirror 418 and converged by an objective lens 419. Assuming that the first and second light beams radiated from the objective lens 419 are respectively represented by BM and BW, the imaging positions of the light beams BM and BW are spaced apart by the predetermined gap $g_o$ along the optical axis of the objective lens 419. In other words, when a mask 20 and a wafer 21 are opposed with a gap $g = g_o$ therebetween, the beam spots of the light beams BM and BW are respectively imaged at the mask 20 and the wafer 21. Thus, the numerical aperture of the objective lens is selected such that its depth of focus becomes smaller than the gap g.

The light information reflected from the mask and the wafer impinge as backtalk on the objective lens 419, are transmitted through the half mirror 418 and arrive at a polarizing beam splitter 426. The polarizing beam splitter 426 separates the light information from the mask and the wafer into two beams by polarization and they are respectively directed to first and second photoelectric sensors 427 and 428. The photosensitive surface of the photoelectric sensor 427 is selected conjugate with the imaging position of the light beam BW and also the photosensitive surface of the photoelectric sensor 428 is selected conjugate with the imaging position of the light beam BW. The first and second photoelectric sensors are each comprised, for example, of a one-dimensional image sensor capable of detecting the size of the beam spot on the mask or the wafer.

The wafer 21 is moved in a lateral direction within the paper plane in the FIG. 20 and in a direction perpendicular to the paper plane by a stage 451 which is movable two-dimensionally on a base 450. Also, an actuator 452 is mounted on the stage 451 so as to vertically move a wafer holder 454. The mask 20 is held by a mask holder 459. The wafer holder 454 is moved vertically so as to establish the gap between the mask and the wafer. Also, in accordance with the present embodiment the objective lens 419 is vertically movable in the direction of the optical axis relative to the base 450 and the mask. This makes the control easier than vertically moving the mask holder and the wafer together to effect the focusing.

Figure 21:
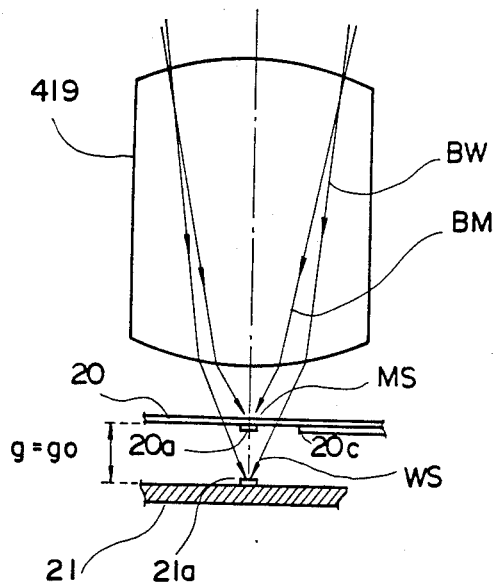
FIG. 21 is an optical path diagram showing the relation between the beam spots and the marks in the apparatus of FIG. 20.
Figure 22:
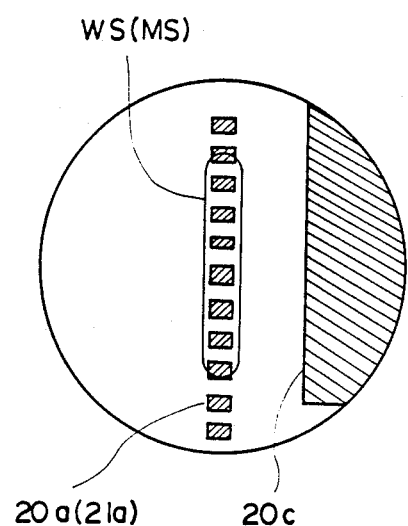
FIG. 22 is a diagram showing the positional relation between the beam spot and the marks within the visual field of the objective lens.

As shown in FIGS. 21 and 22, the first and second light beams BM and BW are projected in such a manner that the optical axis of the objective lens 419 coincides with the center of each of the light beams. The elongated beam spot WS provided by the light beam BW is passed through the transparent portion of the mask and it illuminates marks 21a formed as a grating pattern about 5 μm wide and 100 μm long on the wafer.

On the other hand, the beam spot MS formed by the light beam BM is imaged at a position above and separated by a gap $g_o$ from the beam spot WS on the optical axis of the objective lens 419 and it illuminates marks 20a formed a grating pattern about 5 μm wide and 100 μm long on the mask 20. Here, the beam spots WS and MS are defined to be parallel to each other and their lengthwise directions respectively coincide with the directions of grating arrangement of the marks 20a and 21a. Also, the width of the beam spots WS and MS are selected substantially equal to the width of the marks 20a and 21a.

Note that the marks 20a and 21a form key patterns for making the alignment by the beam spots MS and WS and they are arranged so that the circuit pattern on the mask is brought into register with the circuit pattern on the wafer when the marks 20a and 21a are positioned one upon another. Also, the mask 20 is formed with a reflecting portion 20c having an edge parallel to the marks 20a. The distance between the marks 20a and the edge of the reflecting portion 20c is selected so as to not shield the optical path of the light beam BW which is determined by the numerical aperture of the objective lens 419 and the gap $g_o$. On the other hand, the reflecting portion 20c is provided for reflecting light from the mask 20 and it may be provided by a portion of the circuit pattern on the mask 20.

Figure 23:
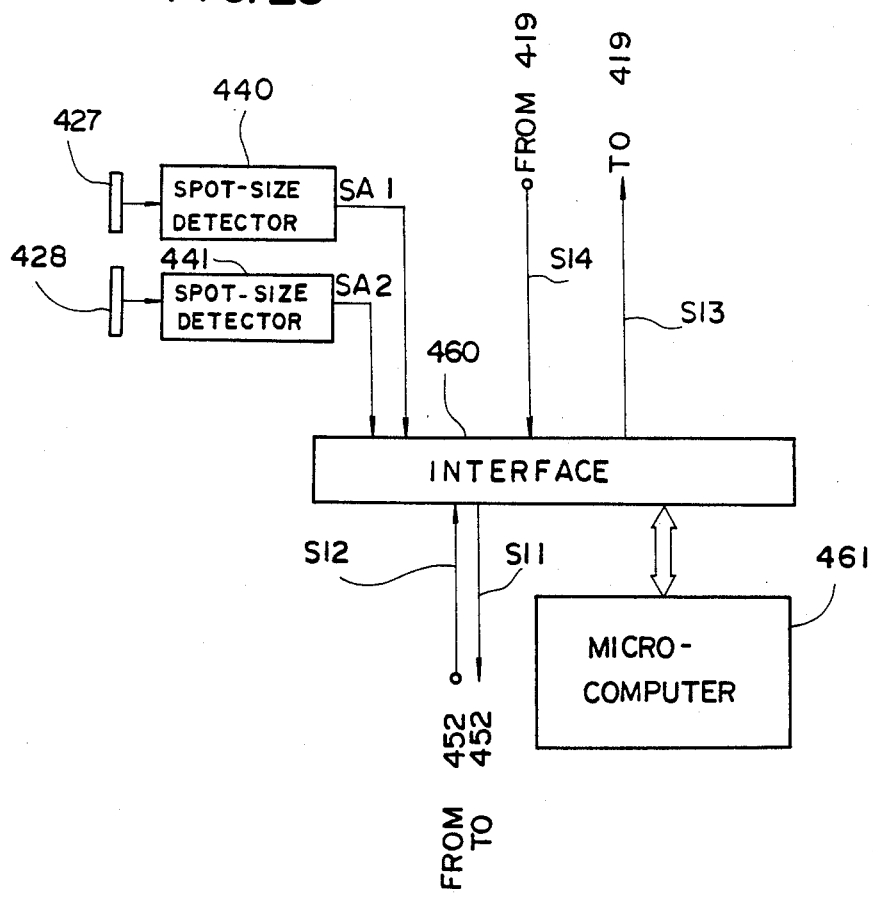
FIG. 23 is a block diagram showing an example of a discriminating unit.

As shown in FIG. 23, the output signals from the one-dimensional image sensors 427 and 428 are respectively applied to spot-size detector circuits 440 and 441 of the same type as that shown in FIG. 4A. The detector circuits 440 and 441 respectively count the number of the photosensitive elements of the one-dimensional image sensors 427 and 428 which are generating photoelectric signals higher than a predetermined value so that when the count values become minimum, detection signals $SA_1$ and $SA_2$ are generated, thus detecting that the beam spots are respectively in focus with the mask 20 and the wafer 21a.

These detection signals $SA_1$ and $SA_2$ are applied to a microcomputer 461 through an interface circuit 460.

As well known in the art, the microcomputer 461 includes memory circuits such as RAM, ROM or the like which store information for controlling the operations of the apparatus and various external information, a central processing circuit for performing computational operations, comparisons, decisions, etc., in accordance with the stored information and so on. Also, the microcomputer 461 sends a drive information $S_{11}$ to the actuator 452 of FIG. 20 and receives a vertical movement information $S_{12}$ of the wafer holder 454 from the actuator 452 through the interface circuit 460. Also, the microcomputer 461 sends a drive signal $S_{13}$ for operating a motor which moves the objective lens 419 and receives a position information $S_{14}$ based on the pulse output of an encoder for measuring the movement of the objective lens 419 through the interface circuit 460.

The operation of the apparatus constructed as described above will now be described with reference to FIGS. 24 and 25. In these Figures, the ordinates of the graphs showing the detection signals $SA_1$ and $SA_2$ correspond to the moved positions of the objective lens 419.

Figure 24:
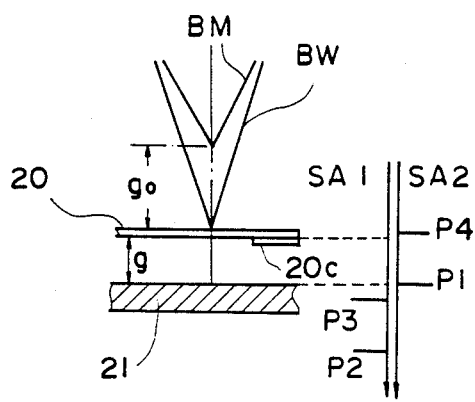
FIGS. 24 and 25 are diagrams for explaining the operation of the apparatus shown in FIG. 20.

Referring first to the case of FIG. 24, if the gap between the mask and the wafer is represented by g, then the gap $g_o$ between the beam spots WS and MS has relation $g_o > g$.

The first and second light beams BM and BW first illuminate the transparent portion of the mask 20. Then, the motor (not shown) is operated in a manner such that the objective lens 419 is moved downward from above the mask 20. When the beam spot WS of the light beam BW is focused on the wafer 21, the spot-size detector circuit 441 generates a detection signal $SA_2$ when the objective lens 419 is at its position $P_1$. When the detection signal $SA_2$ is applied, the microcomputer 461 reads a position information $S_{14}$ and stores the position $P_1$.

When the objective lens 419 is lowered further, the beam spot MS of the beam BM is focused on the wafer 21 and a detection signal $SA_1$ is generated at a position $P_2$. The microcomputer 461 stores the position $P_2$. Note that the difference between the positions $P_1$ and $P_2$ is equal to the gap $g_o$. Then, the first and second light beams BM and BW are made eccentric so that the beam spots MS and WS are imaged on the reflecting portion 20c of the mask 20. This is effected by, for example, tilting the mirror 403 of FIG. 20 by a small angle.

Then, the objective lens 419 is moved upward from below. When this occurs, the beam spot MS is imaged at the reflecting portion 20c and at this position $P_3$ the detector circuit 440 generates a detection signal $SA_1$. When the objective lens 419 is moved upward further, the beam spot WS is imaged at the reflecting portion 20c at its position $P_4$ and a detection signal $SA_2$ is generated. Then, the microcomputer 461 stores the positions $P_3$ and $P_4$. Note that the difference between the positions $P_3$ and $P_4$ is equal to the gap $g_o$. Then, the microcomputer 461 stores the positions $P_1$ and $P_4$ by the beam spot WS of the second light beam BW and the positions $P_2$ and $P_3$ by the beam spot MS of the first light beam BM in correspondence to one another.

Thus, the microcomputer 461 compares the magnitudes of the stored positions $P_1$ to $P_4$ so as to determine whether $P_4 < P_1 < P_3 < P_2$, for example. Since the position $P_2$ represents the case where the beam spot MS is imaged on the wafer 21 and the position $P_4$ represents the case where the beam spot WS is imaged on the mask 20, these positions are not essential information for gap detecting purposes. As a result, the microcomputer 461 performs a comparison $P_1 < P_3$ or computation of $P_1 - P_3$ in accordance with the information of the positions $P_1$ and $P_2$. Since there results $P_1 - P_3 < 0$, the microcomputer 461 determines that the gap g is smaller than the gap $g_o$ and it also detects that the difference between the gaps g and $g_o$ is $|P_1 - P_2|$.

As a result, the microcomputer 461 generates a drive information $S_{11}$ for moving the wafer holder 454 in a direction away from the mask 20 by an amount corresponding to the value of $|P_1 - P_3|$. In this way, the gap g between the mask and the wafer is set equal to the gap $g_o$.

Figure 25:
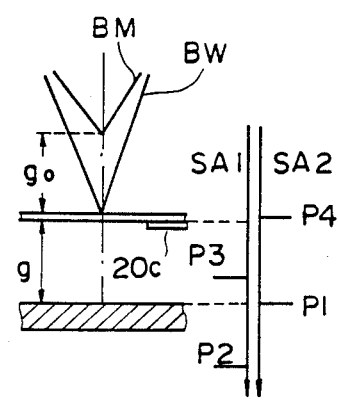

In the case of FIG. 25 (the case of $g > g_o$), the following results. The objective lens 419 scans similarly in the vertical direction so that in response to the resulting detection signals $SA_1$ and $SA_2$ the microcomputer 461 stores the positions $P_1$ to $P_4$. In the case where $g > g_o$, there results $P_4 < P_3 < P_1 < P_2$. Thus, the microcomputer 461 detects $g > g_o$ from $P_1 - P_3 > 0$ and it also detects the difference $|P_1 - P_3|$, thereby generating a drive information $S_{11}$ which causes the wafer 21 to come nearer to the mask 20 by an amount corresponding to the value of $|P_1 - P_3|$.

In this way, whatever gap may separate the mask and the wafer from each other, it is possible to detect the amount of deviation from a given gap $g_o$ and the direction of the deviation (narrow or wide) with a high degree of accuracy only through the vertical scanning by the objective lens.

Figure 26:
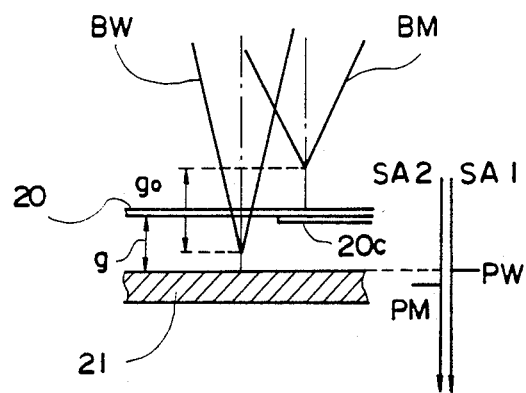
FIG. 26 is diagram for explaining the operation of a modification of the apparatus shown in FIG. 20.

By preliminarily making the first and second light beams BM and BW eccentric with each other so that the beam spots MS and WS do not overlap one another as shown in FIG. 26, it is possible to effect the gap detection at a high speed. These light beams BM and BW may be projected from one and the same objective lens or alternatively they may be projected separately from two objective lens. It is arranged so that the second light beam BW illuminates the wafer 21 through the transparent portion of the mask 20 and the first light beam BM eccentric with the second light beam BW illuminates the reflecting portion 20c of the mask 20. Here, the imaging positions of the beam spots MS and WS of the first and second light beams BM and BW are set to the gap $g_o$.

In this condition, when the objective lens is moved downward from above, the beam spot WS is imaged at the wafer and a detection signal $SA_1$ is generated at the corresponding position PW of the objective lens. When the objective lens is moved further downward, the beam spot MS is imaged at the reflecting portion 20c and a detection signal $SA_2$ is generated at a position PM.

In accordance with the positions PW and PM and the order in which the detection signals $SA_1$ and $SA_2$ were generated, the microcomputer detects whether the gap g is narrow or wide as compared with the gap $g_o$ and detects the difference therebetween.

In this case, since PW<PM, the detection results in $g<g_o$.

In accordance with this embodiment, the gap detection can be effected by simply moving the objective lens, the mask and the wafer relative to one another in one direction and therefore a high-speed processing is accomplished as compared with the embodiment shown in FIG. 20.

With the embodiments described above, it is possible to arrange the mask and the wafer with a wider (or narrower) gap than a predetermined gap $g_o$ therebetween and then vertically move the objective lens, thereby detecting the gap between the mask and the wafer. In this case, discriminating means needs not discriminate whether the gap g is great or small as compared with the gap $g_o$ and it is only necessary to discriminate the amount of deviation of the gap g from the gap $g_o$.

What is claimed is:

1. An apparatus for adjusting a gap between a first flat sheet and a second flat sheet which are disposed in parallel with a plane, at least a localized area of said first flat sheet transmitting light, said apparatus comprising:
   light beam radiating means for radiating toward said light transmission area of said first flat sheet first and second light beams so as to be respectively imaged at positions separated by a first predetermined distance in a direction intersecting said plane and a second predetermined distance in a direction of said plane, said second light beam being passed through said first flat sheet at a position different from the imaging position of said first light beam;
   means for relatively moving the imaging positions of said first and second light beams and said first and second flat sheets in the direction of optical axes of said first and second light beams; and
   detecting means for generating a first detection signal when the imaging position of said first light beam substantially coincides with said first flat sheet and for generating a second detection signal when the imaging position of said second light beam substantially coincides with said second flat sheet.

2. An apparatus according to claim 1, wherein said first flat sheet includes a light reflecting area, and wherein said first light beam illuminates the light reflecting area of said frist flat sheet and illuminates said second flat sheet.

3. An alignment apparatus for bringing a flat sheet having mark means defined by peripheral edges on one surface thereof into register with a predetermined plane comprising:
   light beam radiating means for radiating a light beam so as to be imaged at said predetermined plane;
   means for arranging said flat sheet in said light beam so that said mark means is illuminated by said light beam;
   first focusing means having means for photoelectrically detecting a regular reflected light of said light beam from said mark means and means for controlling a distance between said predetermined plane and said flat sheet; and
   second focusing means for photoelectrically detecting scattered light generated from said mark means and means for controlling a distance between said predetermined plane and said flat sheet.

4. An apparatus according to claim 3, wherein said radiating means includes means for relatively moving said light beam and said flat sheet along said predetermined plane and said detecting means of said second focusing means receives the scattered light generated from said edges of said mark means.

5. An apparatus according to claim 3, wherein said mark means includes a grating pattern, and wherein said light beam radiating means radiates a beam of coherent light such that a spot of light imaged at said predetermined plane has substantially the same size as said grating pattern.

6. An apparatus for oppositely arranging a first light transmitting flat sheet having first aligning mark means and a second flat sheet having second aligning mark means and aligning relative positions of said flat sheets, said apparatus comprising:
   an imaging optical system;
   light beam radiating means for radiating first and second light beams through said imaging optical system so as to be respectively imaged at first and second planes parallel to each other and having a gap therebetween, imaging positions of said first and second light beams being separated by a predetermined distance in a direction of said first and second planes;
   means for detecting an imaging condition of each of said first and second light beams at said flat sheets;
   first control means responsive to said detecting means for controlling said first and second flat sheets into substantial registration with said first and second planes, respectively; and
   second control means for relatively displacing said first and second flat sheets in the direction of said first and second planes such that said first light beam illuminates said first aligning mark means and said second light beam illuminates said second aligning mark means.

7. An apparatus according to claim 6, wherein said imaging optical system has a depth of focus smaller than the gap between said first and second planes at the wavelength of said first and second light beams.

8. An apparatus according to claim 6, wherein said light beam radiating means comprises optical dividing means for dividing by polarization a beam of coherent light into two light beams to produce said first and second light beams; and optical correcting means for differing optical lengths of said divided light beams from each other in accordance with the gap between said first and second planes.

9. An apparatus according to claim 6, wherein said first control means comprises means for dividing by polarization a reflected light of each of said first and second light beams projected onto said first and second flat sheets, and a first and second one-dimensional image sensor for respectively receiving said divided light beams of said reflected first and second light beams to detect sizes of spot images of said first and second light beams imaged on said first and second flat sheets.

10. An apparatus according to claim 6, wherein said second control means comprises means for dividing by polarization light information from said first and second marks on said first and second flat sheets, and a pair of photoelectric sensors for respectively receiving said divided light information of said first and second marks so as to detect said first and second marks.

11. An apparatus according to claim 1 further comprising means for discriminating a magnitude of the gap between said flat sheets in response to said detecting means.

12. An apparatus according to claim 11, wherein said discriminating means discriminates said magnitude of the gap in accordance with the order in which said first and second detection signals are generated.

13. An apparatus according to claim 11 further comprising means for relatively moving said first and second flat sheets to vary the gap between said flat sheets in response to said discriminating means.

14. An apparatus according to claim 1, wherein said beam radiating means includes means for supplying said first and second light beams and an imaging optical system for imaging said first and second light beams respectively, and wherein said first and second flat sheets are positioned on the opposite side of said supplying means relative to said imaging optical system.

15. An apparatus according to claim 1, wherein each of said first and second flat sheets includes first and second mark means which act optically to scatter said first and second light beams, said first and second mark means being arranged apart from each other in the direction of said plane with said second predetermined distance corresponding to said imaging positions of said first and second light beams.

16. An apparatus according to claim 14, wherein said means for supplying said first and second light beams includes an optical means for conducting said first light beam to said imaging optical system along a first optical axis and conducting said second light beam to said imaging optical system along a second optical axis.

17. An apparatus according to claim 16, wherein said optical means includes means for relatively shifting said first and second optical axes in order to adjust said second predetermined distance.

18. An apparatus according to claim 14, wherein said means for supplying said first and second light beams includes means for relatively varying the length of light paths of said first and second light beams in order to adjust said first predetermined distance.

19. An apparatus for adjusting a gap between a photomask and a wafer which are disposed in parallel with a plane and spaced proximately, said apparatus comprising:
an imaging optical system;
light beam radiating means for radiating first and second light beams through said imaging optical system so as to be respectively imaged at positions separtated by a first predetermined distance in a direction intersecting said plane and a second predetermined distance in a direction of said plane;
means for relatively moving the imaged positions of said light beams and said photomask and said wafer in the direction of optical axes of said first and second light beams; and
detecting means for generating a first detection signal when the imaging position of said first light beam substantially coincides with said photomask and for generating a second detection signal when the imaging position of said second light beam substantially coincides with said wafer.

20. An apparatus according to claim 19, wherein said second light beam passed through said photomask at a position different from the imaging position of said first light beam when the imaging position of said first light beam is on said photomask.

21. An apparatus according to claim 19 further comprising means for discriminating a magnitude of the gap between said photomask and said wafer in response to said detecting means.

22. An apparatus according to claim 21, wherein said discriminating means discriminates said magnitude of the gap in accordance with the order in which said first and second detection signals are generated.

23. An apparatus according to claim 21, further comprising means for relatively moving said photomask and said wafer to vary the gap therebetween in response to said discriminating means.

24. An alignment apparatus for bringing a flat sheet having mask means including a grating pattern on one surface thereof into register with a predetermined plane comprising:
light beam radiating means for radiating a light beam so as to be imaged at said predetermined plane;
means for arranging said flat sheet in said light beam so that said mask means is illuminated by said light beam;
first focusing means having means for photoelectricity detecting a regular reflected light of said light beam from said mask means and means for controlling a distance between said predetermined plane and said flat sheet; and
second focussing means for photoelectrically detecting diffracted light generated from said mask means and means for controlling a distance between said predetermined plane and said flat sheet.

25. An apparatus according to claim 6, wherein said second light beam passes through said first flat sheet at a position different from said first aligning mask means.

* * * * *